United States Patent [19]
Morgan et al.

[11] Patent Number: 5,574,856
[45] Date of Patent: Nov. 12, 1996

[54] FAULT INDICATION IN A STORAGE DEVICE ARRAY

[75] Inventors: Lisa A. Morgan, Longmont; Marty Parrish, Lafayette, both of Colo.

[73] Assignee: Fujitsu Limited, Kawasaki, Japan

[21] Appl. No.: 366,032

[22] Filed: Dec. 29, 1994

Related U.S. Application Data

[63] Continuation of Ser. No. 792,702, Nov. 15, 1991, Pat. No. 5,379,411.

[51] Int. Cl.⁶ ........................................ G06F 11/00
[52] U.S. Cl. .................. 395/185.05; 395/182.04
[58] Field of Search ................ 395/578, 185.05, 395/185.06, 185.07, 182.03, 182.04, 183.18, 182.05; 371/10.1, 40.1, 51.1

[56] References Cited

U.S. PATENT DOCUMENTS

| | | | |
|---|---|---|---|
| 3,222,653 | 12/1965 | Rice | 371/10.1 |
| 3,350,690 | 10/1967 | Rice | 371/10.1 |
| 4,005,405 | 1/1977 | West | 371/40.1 |
| 4,051,461 | 9/1977 | Hashimoto et al. | 371/10.1 |
| 4,150,428 | 4/1979 | Inrig et al. | 371/10.1 |
| 4,598,357 | 7/1986 | Swenson et al. | 364/200 |
| 4,817,035 | 3/1989 | Timsit | 364/900 |
| 5,089,958 | 2/1992 | Horton et al. | 371/10.1 |
| 5,124,987 | 6/1992 | Milligan et al. | 371/10.1 |
| 5,220,569 | 6/1993 | Hartness | 395/185.05 |
| 5,253,256 | 10/1993 | Oyama et al. | 371/40.1 |
| 5,255,270 | 10/1993 | Yanai et al. | 371/40.1 |
| 5,283,791 | 2/1994 | Halford | 371/40.1 |

FOREIGN PATENT DOCUMENTS

| | | |
|---|---|---|
| 0416968A2 | 3/1991 | European Pat. Off. |
| 0442531A2 | 8/1991 | European Pat. Off. |
| WO91/13405 | 9/1991 | WIPO |

*Primary Examiner*—Robert W. Beausoliel, Jr.
*Assistant Examiner*—Joseph E. Palys
*Attorney, Agent, or Firm*—Sheridan Ross & McIntosh

[57] ABSTRACT

Method and apparatus are disclosed for providing an indication relating to certain faults that can occur during data storing operations in an array storage system. In connection with providing the indication, a code byte having a number of code bits is appended to data that is stored on storage devices of the array storage system. When such a fault occurs, predetermined code bits are set to indicate the data operation that was taking place when the fault occurred. In a preferred embodiment, there are two data storing related operations for which predetermined code bits are set when a fault occurs, namely, a data reconstruction operation and a data reassignment operation. Since these operations are typically initiated automatically and are transparent to any host system connected to the array storage system, such a fault indication enables the user to determine the identity of the data storing related operation that was in progress when the fault occurred.

10 Claims, 7 Drawing Sheets

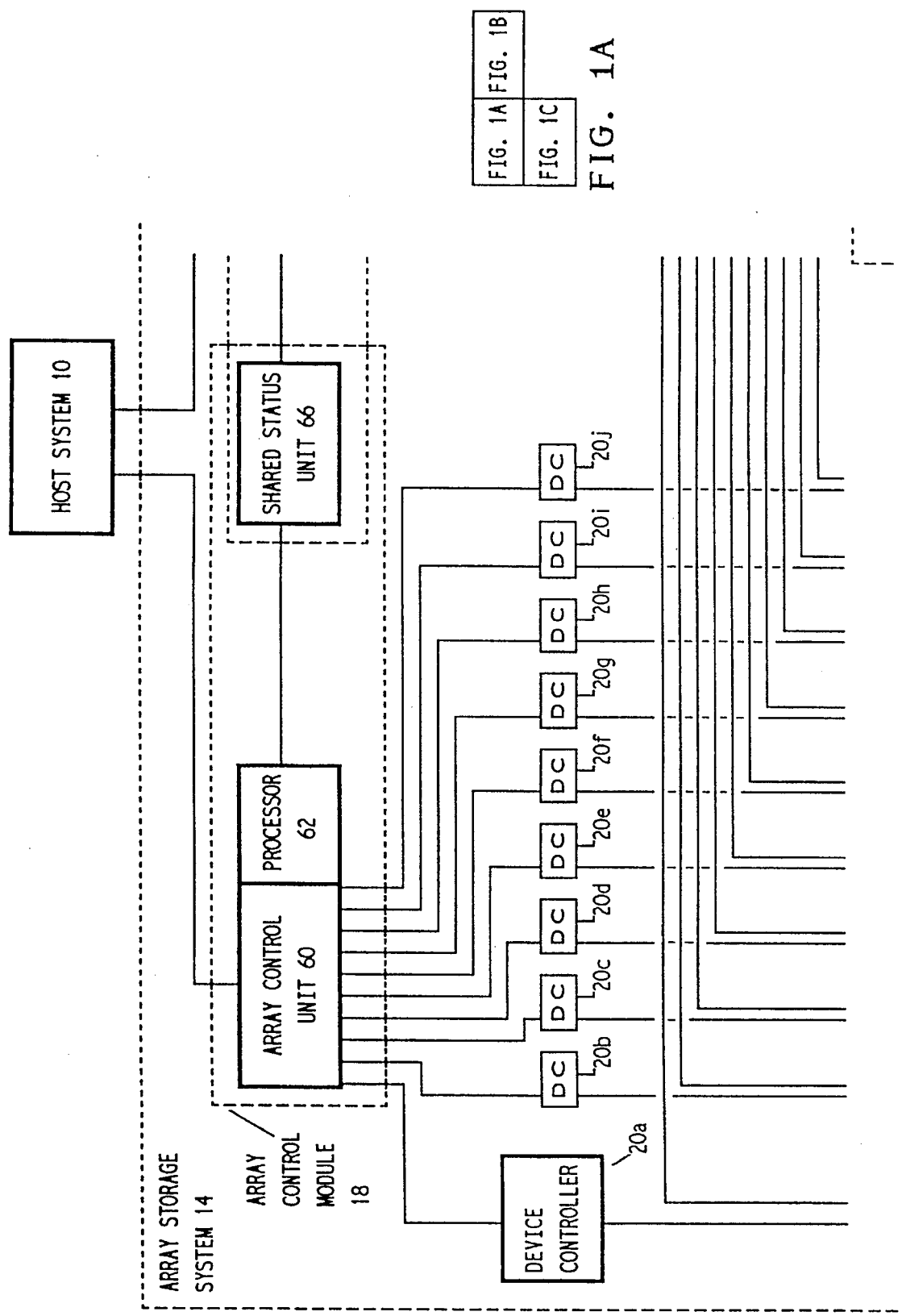

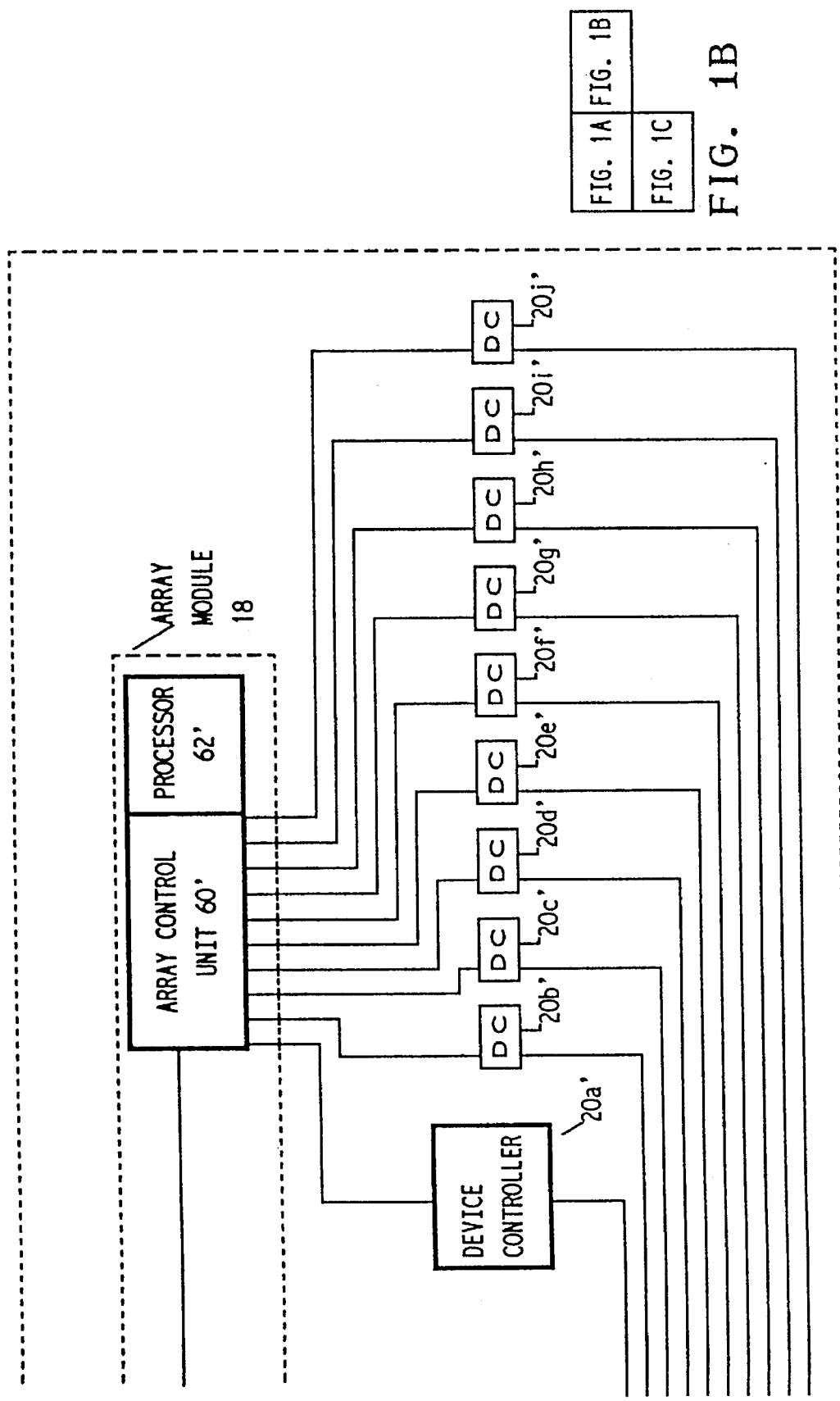

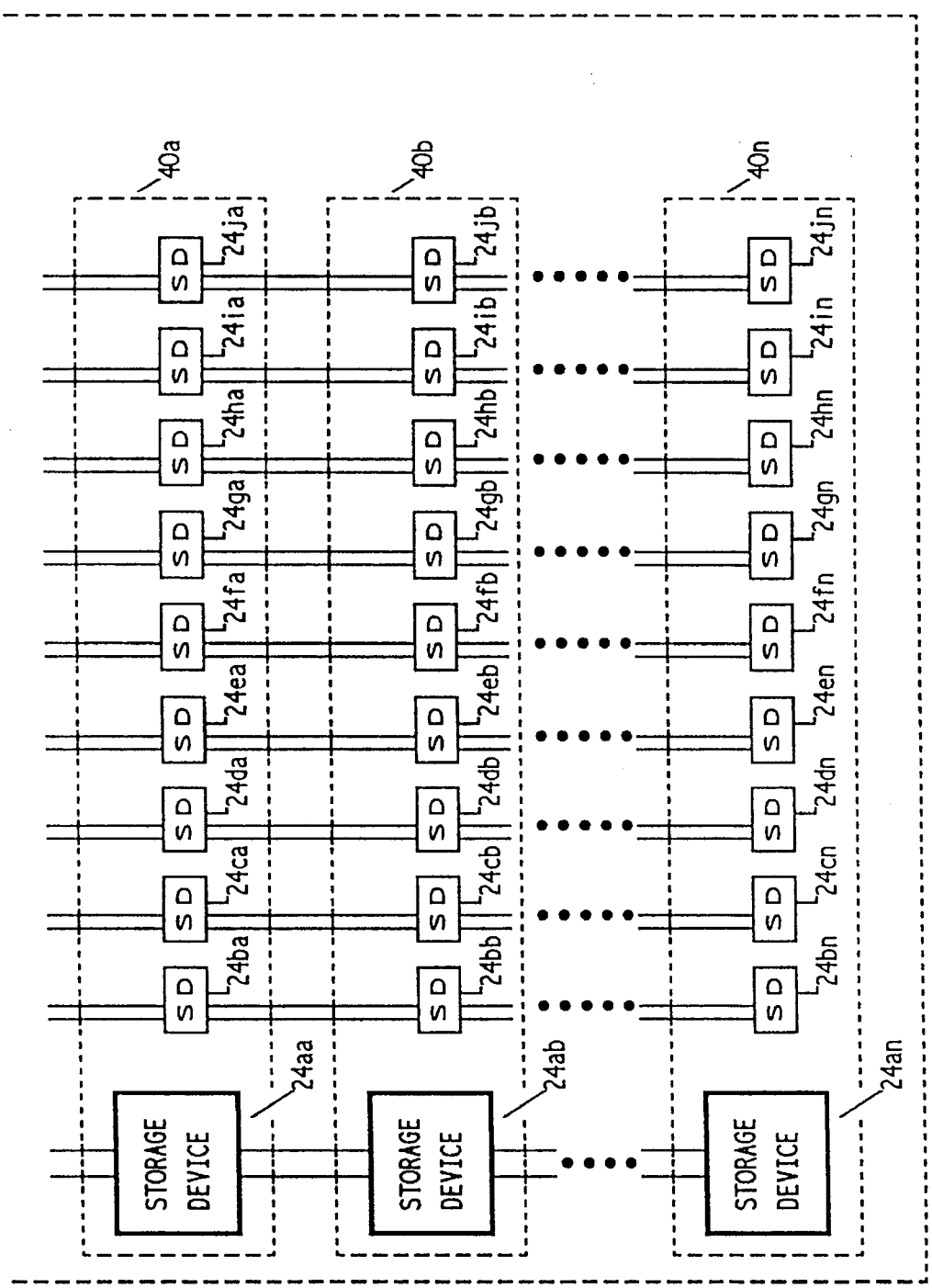

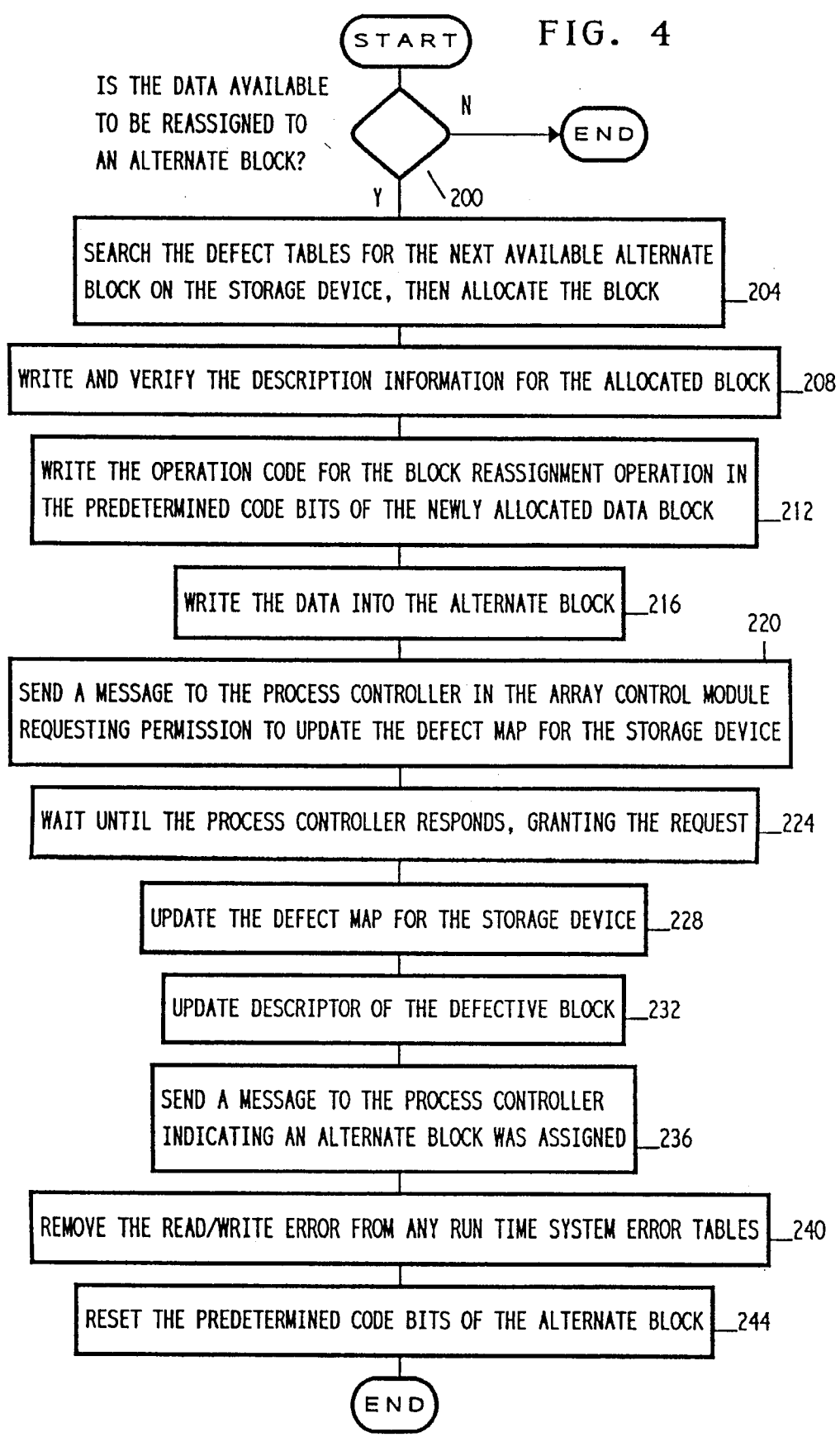

FAULT INDICATION IN A STORAGE DEVICE ARRAY

This is a continuation of application Ser. No. 07/792,702, filed Nov. 15, 1991, now U.S. Pat. No. 5,379,411.

FIELD OF THE INVENTION

The present invention relates to data storage arrays and, in particular, to apparatus and method for providing an indication of a fault which can occur when data is being transferred relative to a number of storage devices.

BACKGROUND OF THE INVENTION

A storage array is used to store distributed data among a number of storage devices. In one embodiment, the storage array includes a number of disk drives. A set of disk drives constitutes the storage devices on which data is stored. A parity drive stores determined parity associated with the data stored on the set of disk drives. A "spare or stand-by" drive is utilized in reconstructing data if one of the data drives should fail.

A storage array typically receives and sends data to a host system upon request by the host system. Because the stored data is distributed data, which must be accurately reassembled when later read or used by the host system, it is important that the storage array be highly fault tolerant and include the capability of identifying the source(s) of error(s). In that regard, it is necessary to utilize operational procedures that monitor and assist in maintaining data integrity. These procedures typically include the use of various check bytes that are appended to the data at all levels of the data transfer operation. Specifically, in transferring data from the host system to the storage array, check bytes may be generated by the host and appended to each block of data received. Such check bytes are checked by the array storage system to determine the accuracy of the data block. Additionally, check bytes are appended to the data bytes during transfer between components of the storage array, such as to device controllers that are involved in reading/writing of data on the storage devices. Such check bytes are also checked during the reading operations associated with the storage array.

In addition to the various data integrity checking operations, it would be advantageous to indicate the identity of the operation in progress when a fault occurred and, more particularly, the identity of the data block that was being transferred at the time the fault occurred. If such information is known, appropriate corrective action can be taken, either close in time after the fault occurred or at the completion of system operation, to rectify any array storage system hardware or software faults.

SUMMARY OF THE INVENTION

In accordance with the present invention, method and apparatus are provided to indicate which particular operation was being conducted when a fault occurred during a data storage related operation. The present invention includes an array storage system that receives/transmits data relative to a host system. In conjunction with the data transfers, the array storage system adds check bytes to blocks of data received from the host system. These check bytes are checked for possible data transfer errors. Such integrity checking, however, does not take into account all faults or errors that can occur during certain situations relating to writing data to storage devices of the array storage system. For example, a fault during a data relocation operation might occur. That is, an attempt to relocate data from one location in the array storage system to another location might fail. Later, the faulty data is read but there is no indication as to how and when the fault occurred. In addition to the cause and nature of the fault, the host system may not be aware of the fault occurrence and therefore would be unable to take corrective action.

The array storage system of the present invention includes hardware and software for identifying operations in progress during such faults by storing information at predetermined storage locations that indicate the identity of the faulty operation. Predetermined code bits in a known storage location are set to provide information relating to the fault. Preferably, the predetermined code bits are part of a byte appended to a data block. In one embodiment, data blocks are generated by the array storage system from data received from the host system and the code byte is appended to each block of data, together with check bytes. When a fault occurs, predetermined code bits of the code byte are set or reset, depending upon the particular operation in progress.

In one embodiment, the data transfer operations themselves control the setting/re-setting of predetermined code bits. A first situation involves a data reconstruction operation where the data on a storage device is reconstructed to a spare device. If there is a failure in generating one or more data blocks in conducting the data reconstruction operation, predetermined code bits are set to indicate a reconstruction data transfer operation failure. In a second situation, predetermined code bits are set/re-set whenever data is written to an alternate storage location of the array storage system. If the data is not written to the alternate storage location for some reason (e.g. system power loss), the previously set predetermined code bits are useful for subsequent storage system integrity analysis. Conversely, if no fault arises, the predetermined code bits, that were set before the write to the alternate storage location are re-set. When a fault does occur, error recovery procedures are accessed. Such procedures will read the code byte and will use the information in the code byte to generate failure information (sense data) that is returned to the host system. Service personnel are able to use the sense data to determine the type of error and when it happened so that appropriate repair or corrective action can be taken.

Based on the foregoing summary, a number of significant advantages of the present invention are readily seen. An enhanced fault detection capability is provided for an array storage system. Because of this, reduced efforts are required to later identify the fault that occurred during certain data transfers. In particular, the identity of an array storage system operation that was being conducted when a fault occurred is provided in predetermined code bits for later access if corrective action(s) need to be taken. Thus, the present invention provides operation error identification without the use of check bytes, Data blocks are labelled with the identity of the faulty operation while communication continues between the host system and the array storage system and any such fault indication can be later analyzed at a convenient time. The present invention provides the capability of alerting future data transfer related operations and/or host system data requests that the integrity of the data being accessed is compromised.

Additional advantages of the present invention will become readily apparent from the following discussion, particularly when taken in conjunction with the accompanying drawings.

BRIEF DESCRIPTION OF THE DRAWINGS

FIGS. 1A–1C are a block diagram illustrating hardware components of the present invention;

FIG. 4 is a detailed flow diagram illustrating the steps associated with a fault indication during the writing of data to an alternate storage location.

DETAILED DESCRIPTION

Figure 2:
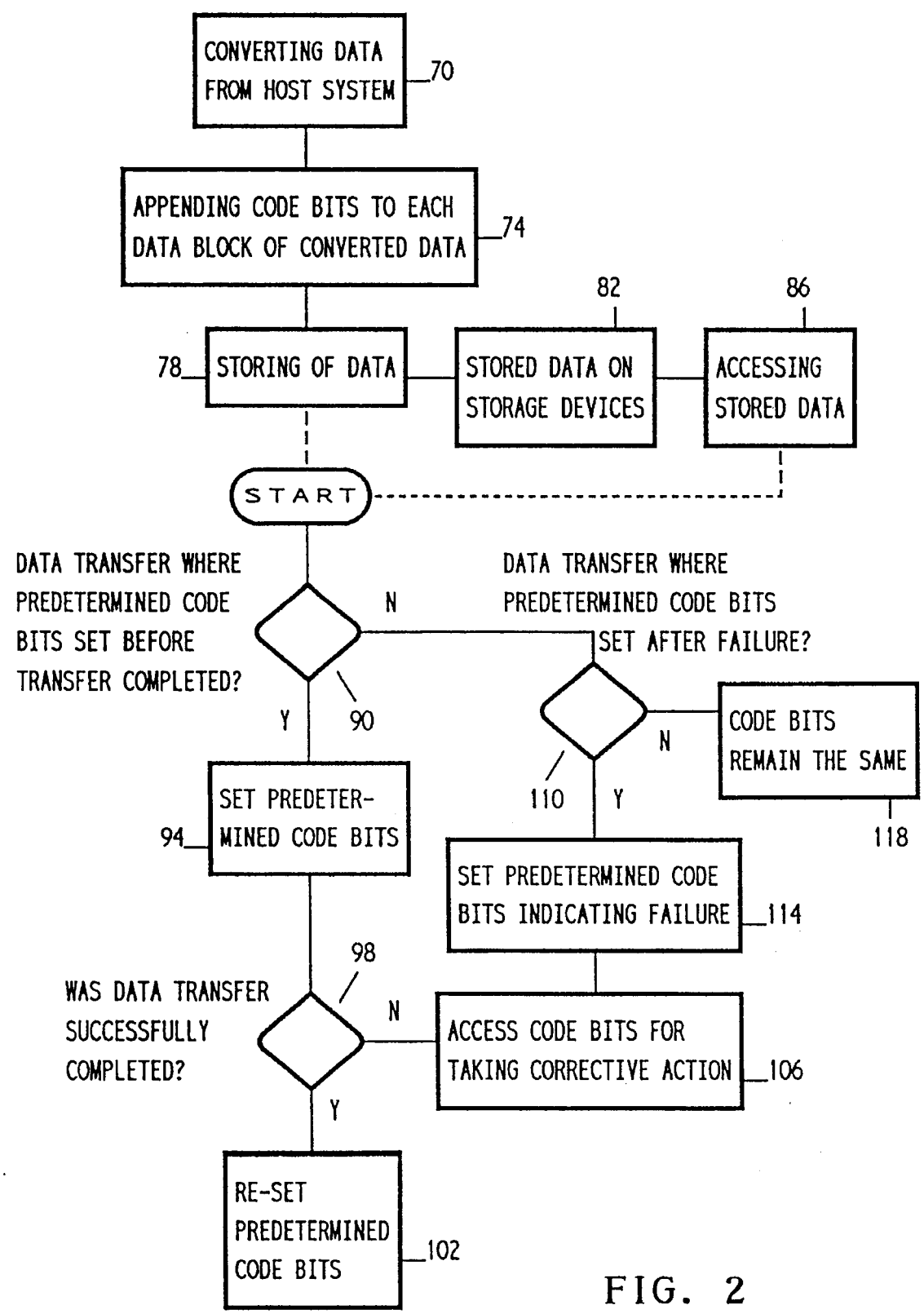
FIG. 2 is a flow diagram illustrating basic steps associated with the indication of a fault during data transfer.

Referring to FIG. 1, a system block diagram is illustrated for implementing the present invention. The system includes a host system 10 that transmits and receives commands data and status messages to/from an array storage system 14 over a suitable interface. Such status messages can, for example, indicate whether an attempted write to the array storage system 14 is successful or not. In connection with data transfers, the interface has a certain bandwidth and data block size. For example, the bandwidth might be four bytes and the data block size 4096 bytes. The host system 10 can include any one of a number of computational devices that have computers for generating and/or requiring data from the array storage system 14. For example, the host system 10 might include extremely large capacity optical storage units, together with processing or computing units, where such a host system 10 wishes to utilize the capabilities of an array storage system 14. Alternatively, the host system 10 could be distributed computer network where requests for reading and writing of data to and from the array storage system 14 come from various computers with network access.

FIG. 1 illustrates that the array storage system 14 includes a number of apparatuses: an array control module (ACM) 18, a plurality of device controllers 20a–20j and a number of dual-ported storage devices 24aa–24ja through 24aN24jN. In one embodiment, N equals eight; so that there are eight multiples of storage devices representing eight "logical volumes" 40a–40N of data. In particular, each of the logical volumes 40a–40N acts as if it were a single, large storage unit. The array control module 18 has responsibility for overall control of the array storage system 14. In particular, the array control module 18 provides for: (1) all data distributing and reassembly between the data configuration of the host system 10 and the data configuration required by the array storage system 14; and (2) scheduling, controlling and monitoring activities relating to the simultaneous data requests to the device controllers 20. Each device controller 20a–20j controls the reading and writing of data from/to the respective storage devices 24aa–24jN to which it is connected. That is, each device controller $20_k$ (k=a,b,c, . . . ,j) determines the exact physical locations on the storage devices $24_ka$–$24_kN$ that data is to be written to or read from. For example, device controller 20a controls reading/writing of data relative to storage devices 24aa, 24ab, . . . 24aN. Each device controller 20a–20j also transmits and receives messages from the array control module 18. For example, such messages are intended to convey the following types of information: (1) storage device write error, (2) cancel write operation, and (3) operation completed. The storage devices 24aa–24aN are the permanent data storage units for data to be used by the host system 10. In one embodiment, each storage device is a disk drive, including one or more disks, such as 5.25 inch magnetic disk drives, although other storage devices such as optical disk drives could be employed.

The ACM 18 includes an array control unit 60 that has, among other responsibilities, the responsibility for converting between the data configuration of the host system 10 and the data configuration required by the array storage system 14. In one embodiment, the host system 10 transmits and receives data blocks of 4096 bytes over a connection of a 4 byte wide bandwidth and the array control unit 60 converts that data into 8 data blocks of 512 bytes each, plus a ninth parity block also of 512 bytes. For each block, data and parity bytes are sent to device controllers 20a–20j for sequential storage to one of the logical volumes 40a–40N. For example, it could be that the first data byte is sent to device controller 20a and the second data byte is sent to device controller 20b and so forth. Continuing with this example where the data is stored on logical volume 40a, device controller 20i, stores, on storage device 24ia the parity data generated from the data on storage devices 24aa–24ha. The remaining device controller 20j communicates with the storage device 24ja which acts as a spare storage device and is utilized when one of the other storage devices fails. The ACM 18 includes a processor 62 that provides the computational ability to monitor and control the state of the entire ACM 18 as well as determine which device controllers 20a–20j should be involved when data is to be either transmitted or received from the host system 10. The ACM 18 also includes a shared status storage unit 66 for storing status information relating to, among other information, data transmission errors, data reconstruction, and defect mapping tables.

As an example of the operation of the ACM 18, consider a host system 10 request to write data to the array storage system 14 via the array control module 18. Assuming both the array control unit 60 and the processor 62 contained within the array control module 18 are used, the write request is made to a control process executed by processor 62. This process queries the shared status storage unit 66 to determine if the array storage system 14 is in an appropriate state to allow a write request to be executed. If the process grants the write request, then data is written by the host system 10 to the array control unit 60. Status information indicating a write is in process is written to the shared status storage unit 66. The data residing in the array control unit 60 is then converted into the desired data configuration for distribution to the device controllers 20a–20j. The control process executing on processor 62 then transmits write commands to the appropriate subset of device controllers 20a–20j. Each of the appropriate device controllers 20a–20j proceeds to write the data allocated to it to the proper storage device 24ak–24jk, for some fixed k=a,b,c, . . . ,N. Subsequently, a message is sent from each device controller 20 to the control process indicating the completion status of the write operation. A read operation is conducted similarly but with the ACM 18 reassembling the data read from the appropriate storage devices 24aa–24j for transmission in the data configuration suitable for the host system 10.

With further reference to FIG. 1, a preferred embodiment of the array storage system 14 includes a second ACM 18' and a second set of device controllers 20a'–20j'. This second ACM 18' is equivalent to ACM 18 in hardware construction and includes an array control unit 60' and a processor 62'. The shared status storage unit 66 is, as its name indicates, shared by both ACM 18 and ACM 18'. The shared status storage unit 66 includes status information that enables the two ACM's 18 and 18' to function cooperatively in the transfer of data using the same storage devices 24aa–24jN.

The array control unit 60' communicates with corresponding device controllers 20a'–20j'. These device controllers 20' control the transmitting/receiving of data to the same storage devices 24aa–24jN, comprising the logical volumes 40a–40N, but use a second port of the dual ported storage devices 24aa–24jN.

The dual system results in greater array storage system reliability, fault detection, and data transmission than a single array storage system having only one array control module 18. It should be understood, however, that an array storage system 14 with a single array control module and one set of device controllers can be used in implementing the present invention. It should be further understood that another embodiment of the present invention includes only a single logical volume. This embodiment may include one of two different variations. In the first variation, the storage devices of the logical volume are single ported; in another variation, the storage devices are dual ported. Additionally, although the described embodiment has N=8 logical volumes, a greater or lesser number of logical volumes can be utilized to implement the fault indicating features of the present invention.

Referring now to FIG. 2, a high level discussion of the fault indicating capabilities of the present invention will now be provided. FIG. 2 illustrates, conceptually, the fundamental steps involved in providing a fault indication whenever certain or predetermined faulty operations occur. The identity of the faulty operation is indicated using predetermined code bits that identify the particular data transfer operation that was taking place at the time of the fault. In addition to identifying the data operation, the code bits may also provide information relating to the storage device(s) and/or data block(s) involved when the fault occurred. Preferably, the code bits are part of a code byte that accompanies a block of data that is stored or is to be stored on one of the logical volumes 40a–40N having the respective storage devices 24aa–24jN.

More specifically, with reference to the steps of FIG. 2, at step 70, data from the host system 10 is converted to a data configuration suitable for the array storage system 14. In conjunction with converting the data to a suitable configuration, at step 74, a code byte having a number of code bits is appended to each block of the configured data. In one embodiment, a data block of 4096 bytes from the host system 10 is converted to eight blocks of 512 bytes. Each of these blocks of data has 15 check bytes and one code byte appended to the 512 bytes of data in the block. The code bits that are appended can be of any known configuration, e.g., all logical zeros or all logical ones. Generally, after the code byte is appended, the next step at 78, relating to the storing of data, is taken. In conjunction with the use of the code byte, two basic alternatives are available. In a first alternative, at step 82, the data is stored on the storage devices of the selected volume for later reading or accessing, as indicated by step 86. In this first alternative, setting or re-setting (changing) of predetermined code bits may be required during such later data reads or transfers. In a second alternative, the setting or re-setting (changing) of predetermined code bits may be required as part of the storing of the data.

With respect to each of these two alternatives, further steps are taken, as illustrated in FIG. 2. At step 90, a determination is made as to whether there is a data transfer where code bits are set before the transfer is completed, particularly even before the transfer is initiated. For example, the data transfer may be the writing of data to alternate blocks or storage locations. This particular data transfer that involves the setting of code bits will be more fully discussed in connection with a description of FIG. 4. If such a data transfer is occurring, predetermined code bits of the code byte are set at step 94 providing an indication that this data transfer is occurring. In step 98, a determination is made as to whether or not this data transfer was successfully completed. If successful, at step 102, the predetermined code bits that were previously set are now reset so that no inaccurate fault indication exists in the predetermined code bits. On the other hand, if the data transfer was not successfully completed, the code bits remain set. The set code bits are accessed using error recovery routines and the accessed code bits are used in generating failure data that is utilized by service personnel in taking corrective action at step 106. It should be understood that the setting and unsetting (re-setting) of the predetermined code bits refers to, respectively, setting the bits to preselected values, one per each operation whose failure is to be detected, and, unsetting the bits to some preselected value indicating no failed operation.

Returning to step 90, if the data transfer operation is not one where the code bits are set before the data transfer is completed, a determination is made in step 110 as to whether predetermined code bits are to be set after a data transfer failure occurred. For example, there may be a failure involving a data reconstruction operation and predetermined code bits are set only after such a failure is detected. This particular embodiment involving a data reconstruction will be more fully discussed in connection with the description of FIG. 3. If such a failure occurs, at step 114, the predetermined code bits are set indicating this particular fault. As with the other fault, at step 106, the code bits can be accessed in the same manner as indicated above. Thus, determination can be made as to which data operation was taking place when the fault occurred. If, however, no failure occurs, the code bits remain the same as indicated at step 118.

Figure 3A:
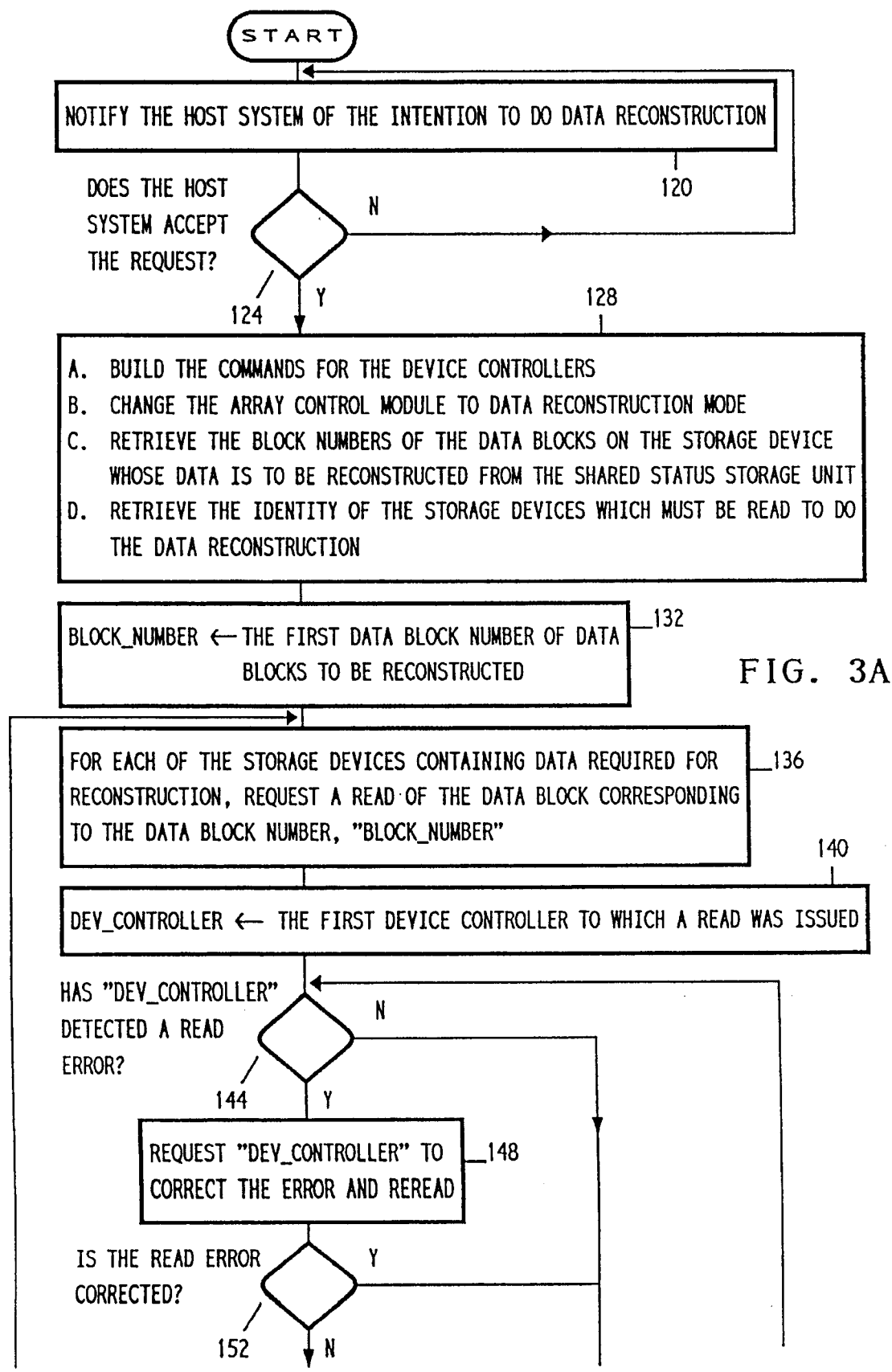
FIGS. 3A–3B are detailed flow diagram illustrating the steps relating to the indication of a fault during a data reconstruction.
Figure 3B:
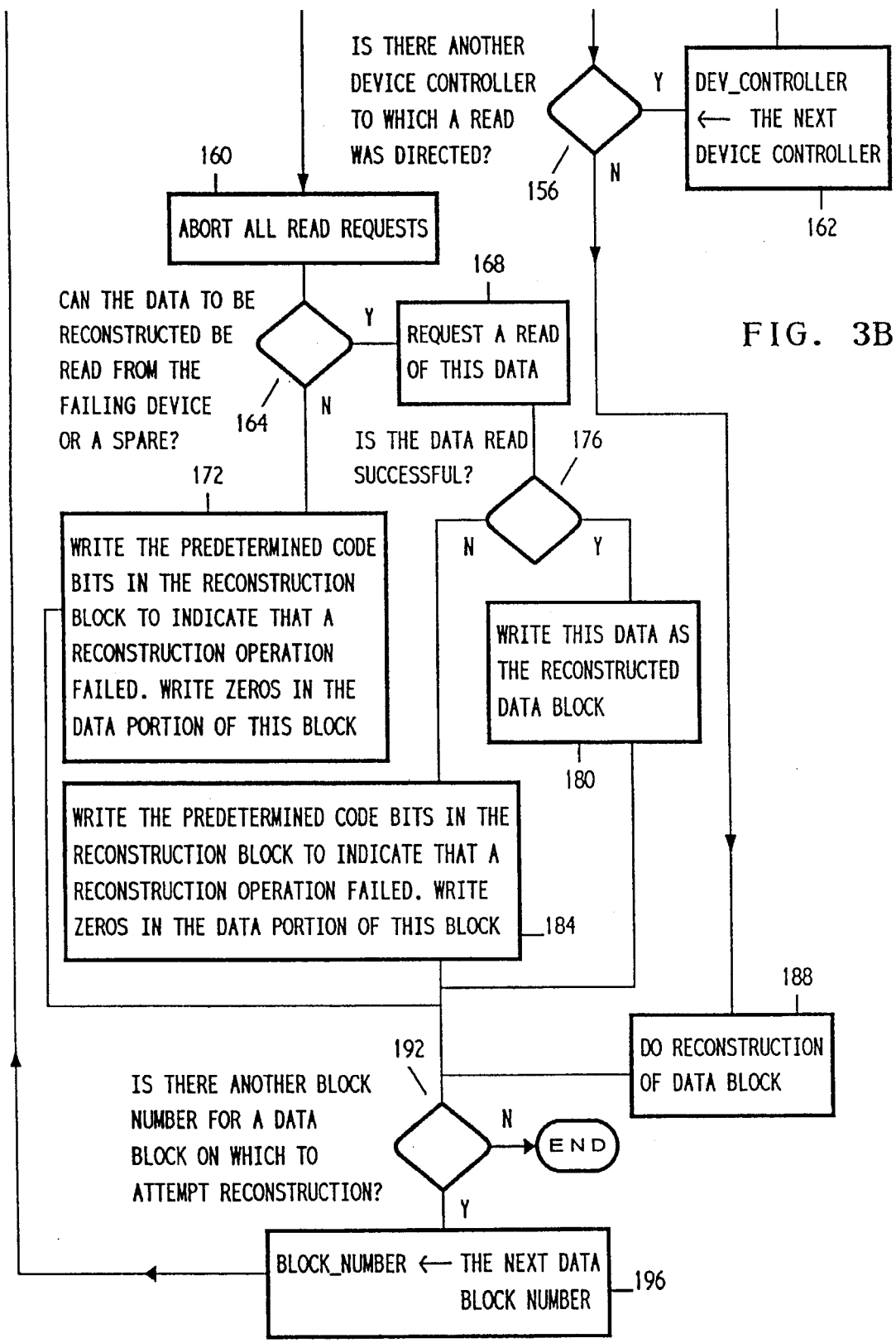

The present embodiments of the invention include two operations where the code bits can be used for indicating the occurrence of a fault. FIGS. 3A–3B provide a representation of the algorithm used in connection with data reconstruction. FIG. 4 provides a representation of the algorithm used in connection with data block reassignment. Both algorithms will be discussed below, however, it is important to note that there are other situations where the code bits could be used. For example, if an automatic real time versioning or archival storage system were integrated in to the current array storage system 14 such that, in a manner transparent to the host system 10, this versioning storage system saved sufficient information to restore the current and some number of previous versions of each data block, then the code bits could be used to store the status or failure of this versioning storage system for each data block of the array storage system that is not versioned properly.

With reference to FIGS. 3A–3B, this algorithm is initiated by a process controller residing in an ACM, and the algorithm is executed by the ACM's processor. The input includes the location of the storage device whose data blocks are to be reconstructed and also the location of the storage device that is to contain the reconstructed data. To assist in the description of FIGS. 3A–3B, it will be assumed that the logical volume 40a having storage devices 24aa–24ja is to be reconstructed and the ACM 18 controls the reconstruction task. Further, the storage device 24 whose data is to be reconstructed will be referred to as the "failed device" and the storage device 24 that is to contain the reconstructed data will be referred to as the "spare device".

In step 120 the host system 10 is notified of the intention of the array storage system 14 to initiate the data reconstruction. In the current embodiment of the invention, if the host system 10 responds indicating non-acceptance in step 124, the array storage system 14 responds with the same request again. When the host system 10 responds with acceptance in step 124 then the array control module 18 initiates and completes (a) through (d) of step 128. Specifically,

128*a*. All read and write commands are constructed;

128*b*. The array control module 18 is reconfigured to do reconstruction;

128*c*. All block numbers for the data blocks of the retired device are retrieved;

128*d*. The identity of the storage devices 24 whose data blocks must be read to reconstruct the data blocks of the retired device are obtained. Note this includes any storage devices 24 containing parity blocks.

To also assist in the description, the storage devices 24 identified in step 128*d* will be referred to as "reconstruction devices."

In step 132 the variable, "block_number," is assigned the block number of the first data block on the failed device to be reconstructed. Note that this block number also identifies the data blocks on the reconstruction devices that must be read in order to reconstruct the block on the retired device. In step 136 a read request is issued to the device controllers 20 connected to the reconstruction devices. The device controllers attempt to read the data blocks, from each of the reconstruction devices, that corresponds to the data block identified by "block_number" on the failed device. In step 140 the variable, "dev_controller," is assigned the identity of the first device controller 20 to which a read was issued in step 136. In step 144 a determination is made as to whether the device controller identified by "dev_controller" has detected a read error. If no error is detected the path to step 156 is followed. This path will be discussed more fully below. Briefly, however, another device controller is checked for read errors and reconstruction is eventually accomplished if all device controllers report successful reads. If an error is detected, then in step 148 the ACM 18 requests that the device controller having the error attempt to correct the read error and reread the data block. In step 152 a determination is made as to whether the read error was corrected. If the error is corrected, then a path to step 156 is once again followed. If not, then data reconstruction cannot be accomplished since the current embodiment of the invention requires valid data to be retrieved from all reconstruction devices for reconstruction to be feasible. Therefore, in step 160 the ACM 18 aborts all read requests to all device controllers 20 connected to reconstruction devices. Occasionally, due to data transfers between storage devices 24, the data block to be reconstructed can be read from some storage device 24. In step 164 a determination is made as to whether the data block identified by "block_number" on the failed device can be obtained from some storage device 24 in the array storage system 14. If this data block cannot be obtained, then the data block is unrecoverable since it also cannot be reconstructed. In this case the reconstruction operation for this data block has failed and a valid data block cannot be written to the spare device. Therefore, in step 172 a data block is written to the spare device where predetermined code bits of the code byte for this block are set to indicate that the reconstruction operation failed on this data block. As a further indicator of the failure, all other bytes of the block have zeros written to them.

At this time step 192 is encountered and a determination is made as to whether there is another data block number on which to attempt reconstruction. If so, step 196 sets the variable, "block_number," to the next block number of a data block to be reconstructed. Control is now once again transferred to step 136 where read requests for the blocks corresponding to "block_number" are issued to all device controllers connected to reconstruction devices. Thus, an attempt is made to obtain all data blocks necessary to accomplish reconstruction of the second data block of the failed device.

Continuing, in step 140 "dev_number" is set once again to the first device controller to which a read request was made. Step 144 then checks for a read error. If no read error is detected, then step 156 makes a determination as to whether there are other device controllers to which a request was made. If so, then in step 162 the identity of the next device controller is assigned to "dev_number" as preparation in determining whether this next device controller encountered errors during reading. If no errors are ever detected the steps 144, 156 and 162 are repeated until all device controllers for which a read request was made are checked for errors. Once all such device controllers have been checked, step 156 results in a "no" answer. At this point, all reads have successfully returned data to the ACM 18. Thereafter, in step 188 the ACM 18 reconstructs the data block of the failed device and writes this newly constructed block to the spare device. Step 192 is now once again encountered to determine if there are further data blocks to be reconstructed. If so, new read requests are made in step 136 and the process continues.

There are only two paths in FIGS. 3A–3B remaining to be discussed. The path leading to step 156 from step 152 and the path leading to step 168 from step 164. The former path is merely an alternate path taken if a device controller encounters a read error but is successful upon a reread. That is, in step 144 the device controller is requested by the ACM 18 to correct the error and reread. If in step 152 the reread is successful then, just as before, an attempt is made to obtain another device controller to check for read errors. If no further device controllers need be checked, then reconstruction of the data block can proceed in step 188. In the latter path, a determination is made at step 164 as to whether the data block that was to be reconstructed, but could not be due to read errors on the reconstruction devices, can be located elsewhere on the storage devices 24 of the array storage system 14. If the data block is located, then in step 168 a request is made to the appropriate device controller to read this data block. In step 176 a determination is made as to whether this read is successful. If so, then in step 180 the data from this block is written to the spare device as the reconstructed data. Otherwise, this data block is unrecoverable and the reconstruction operation on the block has failed. Therefore, in step 184 a data block is written to the spare device where predetermined code bits of the code byte associated with this block are set to indicate that the reconstruction operation failed on this data block. As a further indicator of the failure, all other bytes of the block have zeros written to them.

FIG. 4 presents the algorithm employed by a device controller 20 associated with a storage device 24 upon which a data block is to be reassigned to a different location on the same storage device 24. In this embodiment, data reassignment occurs at some time after a read or write error occurs relative to the data block being transferred. Note that prior to the invocation of this algorithm, the device controller requests permission to correct the data block read/write error. Once permission is granted, the device controller 20 attempts to correct the data block without reassigning the data to an alternate block. It is only after all block rereads and error correcting capabilities have failed is the algorithm of FIG. 4 invoked. The input to the algorithm includes the storage device location, the location on the storage device of the data block to be reassigned, which ACM 18 is to control the reassignment operation, and the read/write error causing this reassignment attempt.

In step 200 the device controller determines whether the data contained in the data block to be reassigned can be obtained. If the data cannot be obtained, then reassignment is not possible. The algorithm terminates. Note that no predetermined code bits are set. The reasoning here is that since the algorithm of FIG. 4 is only performed after a read/write error, this implies that the host system 10 can be alerted to the error as a relevant response to the current processing on the host and the block can be marked as being faulty by other means than the predetermined use of code bits.

In step 204 the device controller searches the defect tables of the storage device for the next available alternate block. Once a block is found, it is allocated. Note that in the current embodiment of the invention there are substantially more alternate blocks than are needed for the life expectancy of a storage device 24. In step 208 a description or header is written on the storage device 24 for the newly allocated alternate block. The header contains information about the contents of the data block. For example, the header can contain information indicating that the alternate block is now allocated, the size of the block, and, any previous and/or subsequent data block locations to be associated with the block.

In step 212 the operation code for block reassignment is written into the location for the predetermined code bits of the alternate block. This insures that upon failure due to power loss, recovery is possible. In step 216 the data is written to the alternate block. In step 220 a message is sent to the controlling ACM 18 process controller requesting permission to update the defect map for this storage device. In step 224 the device controller waits for a response from the controlling ACM 18 process controller granting the request. In the current embodiment of the invention, prior to granting the request, the process controller in the ACM 18 sets a flag in the shared status unit 66 to alert the other ACM 18' that the defect map for the storage device is being modified. This prohibits the other ACM 18' from accessing incorrect defect mapping information.

In step 228 the defect map for the storage device is updated. In step 232 the header for the defective block is updated to indicate for instance, that there is an alternate block. In step 236 a message is sent to the process controller indicating that an alternate block was assigned, thus allowing the process controller to alert the other ACM 18 that the defect maps can be accessed. In step 240 the device controller removes the read/write error to which this reassignment was a response. Finally, in step 244 the predetermined code bits of the alternate block are reset in the case in which the reassignment was completed successfully.

If at any point after step 212 the reassignment operation fails, then the predetermined code bits are not re-set or changed. Thus, a system maintenance person, at some future time, can invoke error routines that access the set code bits and generate failure information (i.e. sense data) to be used by this person in determining that a fault occurred during the storing of data to an alternative storage location.

The foregoing description of the invention has been presented for purposes of illustration and description. The description is not intended to limit the invention to the form disclosed. Consequently, variations and modifications commensurate with the above teachings and the skill or knowledge in the relevant art are within the scope of the present invention. The embodiments described hereinabove are further intended to explain the best mode known of practicing the invention and to enable others skilled in the art to utilize the invention in various embodiments and with the various modification required by their particular applications or uses of the invention. It is intended that the appended claims be construed to include alternative embodiments to the extent permitted by the prior art.

What is claimed is:

1. A method for indicating whether a fault occurs associated with at least first and second data transfer related operations in an array storage system, comprising:

providing code means including a plurality of code bits, with said code bits being in a first state;

altering at least a first predetermined code bit of said code bits to a second state, different from said first state, before said first data transfer related operation and before a fault related to said first data transfer related operation;

conducting said first data transfer related operation and, when no fault occurs during said step of conducting said first data transfer related operation, modifying said code bits differently from said second state;

performing said second data transfer related operation, which is different in type from said first data transfer related operation; changing at least a second predetermined code bit of said code bits when a fault occurs after said step of performing has begun but not changing said second predetermined code bit when the fault does not occur; and accessing said code bits for use in taking corrective action using information in said code bits.

2. A method, as claimed in claim 1, wherein:

said second data transfer related operation includes a data reconstruction operation in which a determination is made that a storage device cannot be properly used to reconstruct data and said step of changing said second predetermined code bit is conducted after a determination is made that said data reconstruction cannot be successfully completed.

3. A method, as claimed in claim 1, wherein:

said first data transfer related operation includes a write to an alternate storage location in which the storing of data to said alternate storage location was not successfully completed and said step of changing occurs before completion of said write to said alternate storage location.

4. A method, as claimed in claim 1, wherein:

said step of accessing includes determining an identity relating to the fault using said second predetermined code bit whenever said second predetermined code bit was changed due to occurrence of the fault.

5. A method, as claimed in claim 4, wherein:

said step of accessing includes taking corrective action to remedy said fault using said identity relating to said fault determined using said second predetermined code bit.

6. An array storage system communicating with a host computer, comprising:

a plurality of storage devices including a spare storage device and a number of storage devices for storing data which constitutes a data block;

a plurality of device controllers communicating with said plurality of storage devices; and array control means communicating with the host computer for receiving and transmitting said data block from and to the host computer, said array control means for performing each of the following operations:

a first operation for distributing said data, all of which together constitute said data block transmitted from the host computer, into said plurality of device controllers;

a second operation for appending code bits to at least some of said data before said first operation;

a third operation for reassembling said data block from each of said data read using at least some of said plurality of device controllers;

a fourth operation for conducting a first data transfer related operation;

a fifth operation for altering at least a first predetermined code bit of said code bits;

a sixth operation for reconstructing said data block by using said plurality of storage devices; wherein said sixth operation is a type of operation different from said fourth operation;

a seventh operation for detecting a data transfer error between said array control means and said plurality of device controllers; and an eighth operation for changing at least a second predetermined code bit of said code bits based on said seventh operation, wherein said changing is conducted at a time associated with said sixth operation different from the time that said altering is conducted associated with said fourth operation.

7. An array storage system, as claimed in claim 6, wherein:

said first predetermined code bit is used to identify said first data transfer related operation.

8. An array storage system, as claimed in claim 6, wherein:

said data transfer error includes an error that occurred during said sixth operation.

9. An array storage system, as claimed in claim 6, wherein:

said first data transfer related operation includes reassigning said data block to alternate storage.

10. An array storage system communicating with a host computer, comprising:

a plurality of storage devices including a spare storage device and a number of storage devices that store data and said data together on said number of storage devices constituting a data block;

a plurality of device controllers communicating with said plurality of storage devices; and array control means, communicating with the host computer for receiving and transmitting said data block from and to the host computer and for performing the following operations:

a first operation for distributing said data with all of said data constituting said data block transmitted from the host computer, into at least some of said plurality of device controllers;

a second operation for appending code bits to at least some data before said first operation by said array control means after receiving said data block from the host computer;

a third operation for reassembling said data block from each of said data read through at least some of said plurality of device controllers:

a fourth operation for detecting a data transfer error;

a fifth operation for reassigning a data block to alternate storage:

a sixth operation for altering at least a first of said code bits before said fifth operation;

a seventh operation for modifying said first code bit when no fault is detected during said fourth operation due to said fifth operation related to reassignment of said data block;

a eighth operation for reconstructing said data block by using said plurality of storage devices; and a ninth operation for changing at least a second predetermined code bit of said code bits that was detected during said fourth operation due to said eighth operation for reconstructing said data block and for not changing said second predetermined code bit when no data transfer error detected during said fourth operation due to said eighth operation for reconstructing said data block.

\* \* \* \* \*